United States Patent [19]
Tobin et al.

[11] Patent Number: 5,793,612
[45] Date of Patent: Aug. 11, 1998

[54] HEAT SINK STRUCTURE FOR FAST NETWORK HUBS

[75] Inventors: Thomas M. Tobin, Santa Cruz; Gary Robert Schultheis, Los Gatos, both of Calif.

[73] Assignee: Gadzoox Networks, Inc.

[21] Appl. No.: 675,273

[22] Filed: Jul. 1, 1996

[51] Int. Cl.[6] ............................... H05K 7/20
[52] U.S. Cl. ............... 361/705; 165/185; 361/719
[58] Field of Search ............... 165/80.3, 185; 439/485, 487; 257/706, 707, 712, 713, 718, 719; 361/704, 705, 717–719, 722; 174/16.3, 252; 428/349; 252/72–75

[56] References Cited

U.S. PATENT DOCUMENTS

| | | | |
|---|---|---|---|
| 4,444,944 | 4/1984 | Matsushita | 524/786 |
| 4,486,495 | 12/1984 | Matsushita | 428/266 |
| 4,979,074 | 12/1990 | Morley et al. | 361/386 |
| 5,213,704 | 5/1993 | Anderson, Jr. | 252/75 |
| 5,470,622 | 11/1995 | Rinde | 428/34.9 |
| 5,568,360 | 10/1996 | Penniman et al. | 361/687 |
| 5,646,826 | 7/1997 | Katchmar | 361/704 |

*Primary Examiner*—Gerald P. Tolin
*Attorney, Agent, or Firm*—Ronald C. Fish; Falk & Fish LLP

[57] ABSTRACT

The genus of apparatus according to the teachings of the invention is characterized by use of a heat conducting elastomer which is compressed between an integrated circuit and a surface of a chassis made of heat conducting material such as Aluminum. The elastomer conducts heat from the integrated circuit to the surface of the chassis where it warms the entire chassis and is radiated to the ambient and removed by convection cooling. Since the chassis provides a much greater radiating and convection cooling surface, cooling of the integrated circuit is enhanced.

12 Claims, 2 Drawing Sheets

HEAT SINK STRUCTURE FOR FAST NETWORK HUBS

BACKGROUND OF THE INVENTION

The invention pertains to the field of ultrafast network hubs and switches and heat sink structures for very fast electronic circuits having chassis made of metals which are good heat conductors with the high power circuits mounted near a wall of the chassis where the high power circuits are generating large amounts of heat which must be dissipated.

In modern high speed electronic circuit design, integrated circuits are used which generate large amounts of heat which must be dissipated to prevent thermal runaway and/or destruction of the circuit. In personal computers having relative large enclosures, rotating fans have been used to cause airflow over the motherboard and other circuits such as expansion cards to provide convection cooling of the circuits.

SUMMARY OF THE INVENTION

The genus of apparatus according to the teachings of the invention is characterized by use of a heat conducting elastomer which is compressed between an integrated circuit and a surface of a chassis which supports the printed circuit board on which the integrated circuit is mounted. In the preferred embodiment, the chassis is made of a highly conductive heat conducting material such as aluminum, but in other embodiments, the chassis can also be made of steel. The chassis can be made of any material which conducts heat away from the integrated circuit at a sufficiently high rate so as to prevent overheating of the integrated circuit. The elastomer serves as the heat conducting link between the integrated circuit and the chassis. The elastomer conducts heat from the integrated circuit to the surface of the chassis where it warms the entire chassis and is radiated to the ambient and removed by convection cooling. Since the chassis provides a much greater radiating and convection cooling surface, cooling of the integrated circuit is enhanced. In some embodiments, an escutcheon panel or "dress plate" also made of aluminum or another good heat conductor is mounted to the wall of the chassis which makes contact with the elastomer. This can improve the heat radiating capability of the chassis, but the presence of the escutcheon or dress plate is not necessary to practice the invention.

A principal contribution of the invention is in the ability to eliminate the fan in some species of the invention since fans are high failure rate components. In high availability products such as high speed networking products, elimination of the fan can be a significant contribution.

DETAILED DESCRIPTION OF THE PREFERRED EMBODIMENT

Figure 1:
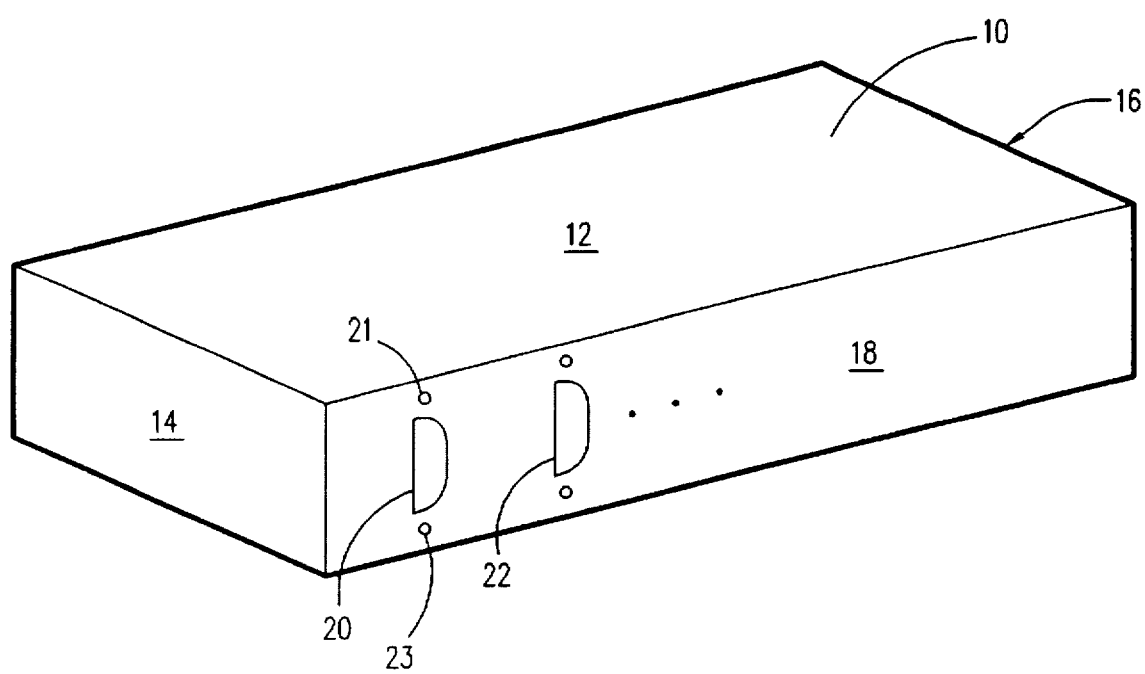
FIG. 1 is a perspective view of the chassis of a typical electronic circuit which can use the teachings of the invention, in this case, a 1 Gigabit Fibre Channel Arbitrated Loop hub.

Referring to FIG. 1, there is shown a perspective view of a Fibre Channel Arbitrated Loop hub which operates at data rates in the vicinity of 1.0625 GigaBits/second. The hub includes an chassis or enclosure 10 which is preferably made of sheet aluminum or some other good heat conductor such as copper, steel, titanium or a high conductivity elastomer or plastic. The chassis 10 preferably defines an enclosed, rectangular box with a fan opening (not shown) although in some alternative embodiments, there may be additional cooling vents or entire sides left open and no fan. In one embodiment, the chassis box encloses the power supply in addition to a printed circuit board upon which high speed integrated circuits are mounted. Because the power supply is enclosed in some embodiments, a fan is mounted to the chassis to circulate air around the power supply to keep it cool. However, fans are high failure rate devices, so in high availability devices such as high speed network products, it is desirable to eliminate the fan to improve reliability of the product. Therefore, in some embodiments, the power supply is not mounted in the chassis that mounts the printed circuit board that contains the high speed networking integrated circuits. In these embodiments, there is no fan mounted on the chassis containing the connectors to which the network drop lines connect, although there may be a fan mounted on a separate remote chassis that contains the power supply to cool the power supply. Hereinafter, the term "chassis" is intended to refer to the chassis that mounts the printed circuit board containing the high speed integrated circuits that are generating heat that needs to be dissapated regardless of whether it also contains a power supply.

The chassis box has two mating halves, one half being the top 12 and two sides 14 and 16. The other half of the box defines the remaining sides. The hub has a front escutcheon plate 18, which is preferably made of aluminum or some other good heat conductor. The escutcheon 18 mounts flush to the front panel of the enclosure (not visible in FIG. 1) by screws, of which screws 21, and 23 are typical. A plurality of port D connectors, of which connectors 20 and 22 are typical, extend through holes in the front wall of the chassis (hereafter sometimes referred to as the front panel) and escutcheon. The escutcheon is the labelled or engraved plate (preferably made of aluminum) which identifies the various connectors and fits over and attaches to the front wall or front panel of the chassis. Drop lines to the various nodes in the Fibre Channel Arbitrated Loop connect to these D connectors.

Figure 2:
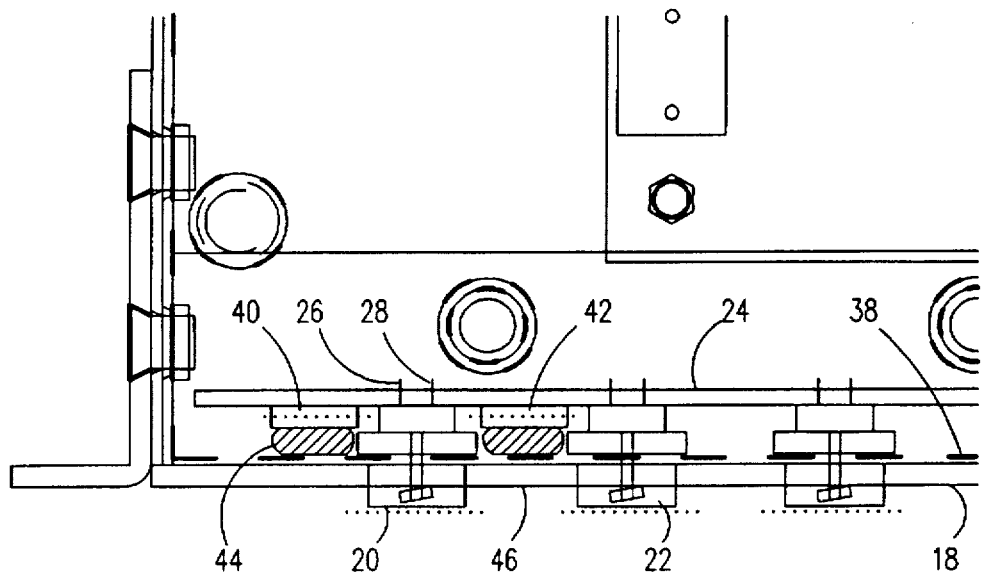
FIG. 2 is a top view of a chassis structure of a high speed hub showing the relationship of the chassis front wall and printed circuit board and several pieces of compressed elastomer employing the teachings of the invention to cool the integrated circuits.
Figure 3:
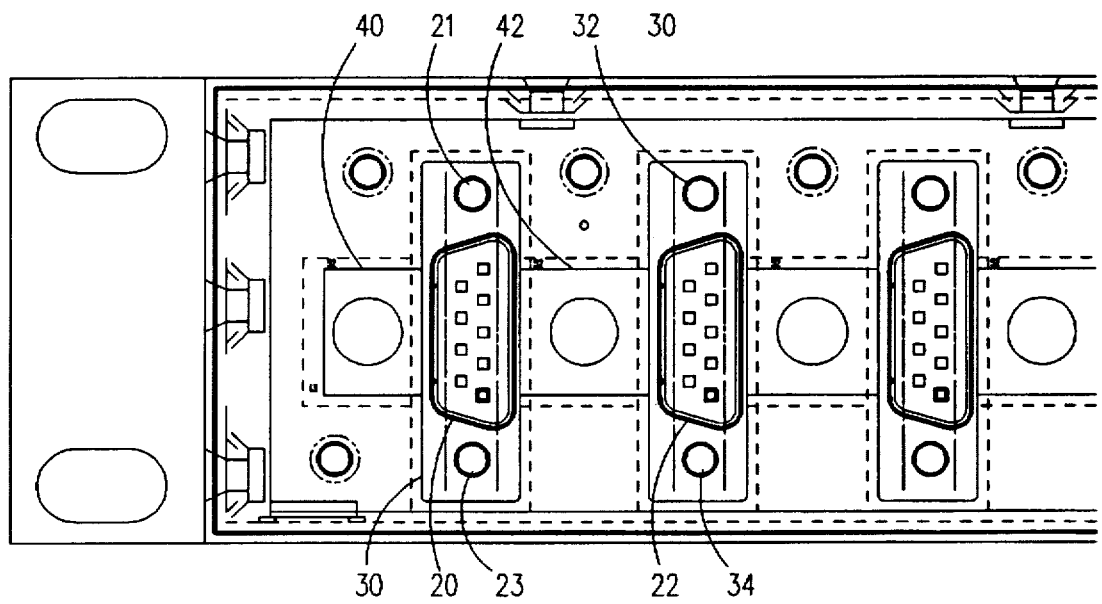
FIG. 3 is a plan view of the front panel of a high speed hub employing the teachings of the invention.

Referring to FIGS. 2 and 3, there are shown top and front detail views, respectively, of the front wall arrangement showing the relationships between the various components of the heat sink according to the teachings of the invention. The circuitry of the Fibre Channel Arbitrated Loop hub is contained on a printed circuit board 24. The D connectors have pins, of which pins 26 and 28 are typical, which extend through the printed circuit board 24 and which are soldered thereto. Each D connector has a raised connector portion outlined by the double line in FIG. 3 touched by the leader lines for reference numerals 20 and 22, and each D connector also has a flange portion 30. Each connector flange portion has two threaded holes therein. The threaded holes in each flange are illustrated typically by holes 32 and 34 on the flange of D connector 22.

The relationship between the front escutcheon plate 18, the front wall 38 of the enclosure 10, the D connectors such as connectors 20 and 22, and the printed circuit board 24 are shown best in FIG. 2. The printed circuit board 24 has one high-speed, surface-mount, hub port repeater integrated circuit per D connector, of which repeaters 40 and 42 are typical. These repeaters get hot because of the high data rate, and this heat must be dissipated to prevent the repeaters from overheating and failing.

In the preferred embodiment, the heat generated by the hub port repeaters is dissipated by placing a deformable heat conducting elastomer material, of which elastomer sections 44 and 46 are typical, between each repeater and the front wall 38 of the enclosure 10 and compressing it to about 70% of its uncompressed thickness. The elastomer has a high thermal conductivity which changes in accordance with the amount of compression of the elastomer and the thickness of the elastomer. In the preferred embodiment, the elastomer is a boron nitride filled silicone elastomer having a density of 1.25 grams/cc, and a 200 mill thickness before compression which yields a thermal resistivity (the measure of thermal conductivity) of approximately 4.5 degrees C. in$^2$/watt at 10 psi compressive force, said 10 psi yielding compression of approximately 24% for a 200 mil thickness, i.e., the compressed elastomer has a thickness of 76% of its uncompressed thickness of 200 mils.

Although 30% compression is selected in the preferred embodiment, any amount of compression adequate to cause a good thermal connection between the elastomer and the repeater it cools and between the elastomer and the front wall of the enclosure will suffice to practice the invention. In general, sufficient compression must be used to squeeze out all the air from between the elastomer and the repeater and from between the elastomer and the front wall of the enclosure. The elastomer has good thermal conductivity properties with compression anywhere between 15% and 100% although 15% and 52% is a more realistic range of possible compressions to use since the force to achieve compression greater than 52% for a 200 mil uncompressed elastomer will be greater than 30 psi. In general, in all species of the invention, the elastomer will be a boron nitride filled silicone elastomer or the functional equivalent thereof which is compressed in the range from approximately 15% to approximately 52% of its uncompressed thickness and which has a thermal resistivity in degrees Centigrade in$^2$/Watt at 10 psi compression of between approximately 1.6 and approximately 4.5.

The elastomer is commercially available as the T-flex 200 Series from Thermagon, Inc. of 3256 West 25th Street, Cleveland, Ohio 44109-1668. The preferred elastomer is a boron nitride filled silicone elastomer having a thermal resistance of 4.5 degrees Centigrade in$^2$/Watt for a 0.2 inch (200 mil) thickness at 10 psi compression force, a dielectric strength in volts/mil of greater than 100, and a density of 1.25 grams per cubic centimeter. The preferred elastomer has, for a 200 mil thickness, a 9% deflection at 3 psi, a 13% deflection at 5 psi, a 24% deflection at 10 psi, a 41% deflection at 20 psi and a 52% deflection at 30 psi. Deflection, as the term is used herein, means the percentage of compression from its original 200 mil thickness.

This elastomer 40, 42 fills the gaps between the top surfaces of the repeaters and the front wall 38 of the enclosure 10 and conducts heat from the repeater to the front wall 38 of the enclosure 10 and from there to the escutcheon plate 18 and the rest of the enclosure/chassis 10.

The elastomer, in the preferred embodiment, has a tacky adhesive on one surface thereof which aids in assembly. Typically, this tacky surface is applied to the top surface of the repeater so as to temporarily hold the elastomer in place during assembly.

After the elastomer is placed on the repeaters, the row of D connectors on the printed circuit board and the threaded holes in their flanges are lined up with mating holes in the front wall 38 and the escutcheon 18. Screws such as screws 21 and 23 are passed through the mating holes in the escutcheon 18 and front wall 38 and are threaded into the threaded holes such as holes 32 and 34 in the flange of each D connector. As these screws are tightened, they draw the printed circuit board 24 closer to to the front wall 38. The dimensions between the printed circuit board 24 and the front wall 38 are such that when the screws are fully seated, the esastomer is compressed to about 70% of its original thickness. Thermal conductivity generally improves approximately linearly with increasing compression.

The thermally conductive elastomer compressed between the repeater chips and the front wall of the enclosure perform the function of conducting the heat generated by the repeaters to the chassis and the front escutcheon plate. Since the chassis and front escutcheon plate have a much greater collective surface area than the repeater chips themselves, the amount of convection cooling that is provided to the repeater chips is greatly enhanced by the thermal conduction path to this large surface area provided by the compressed elastomer.

Although the invention has been described in terms of a single embodiment disclosed herein, those skilled in the art will appreciate that certain modifications can be made to the disclosed structure without departing from the spirit and scope of the invention. For example, the elastomer may be eliminated and Peltier junction devices may be substituted for active cooling of the repeaters or the elastomer may be eliminated and a separate fan may be used to blow air between the printed circuit board and the front wall in the gap formed by using the D connectors as spacers between the front wall of the enclosure and the printed circuit board. All such modifications are intended to be included within the scope of the claims appended hereto.

What is claimed is:

1. An apparatus for cooling at least some integrated circuits in a high speed or high power circuit, comprising an assembly of:

a chassis supporting said high speed or high power circuit, said chassis made of a material having good thermal conductivity and having at least one surface so as to act as the only heat sink of the apparatus;

a printed circuit board having a plurality of integrated circuits mounted thereon which form part of said high speed or high power circuit, each said integrated circuit having metallic pins that are electrically connected to printed circuit traces on said printed circuit board and having at least one surface not in contact with said printed circuit board, at least some of said integrated circuits generating sufficient heat to require cooling beyond that available by radiation and convection cooling to the ambient from the surface area of the integrated circuit alone;

a mounting structure mounting said printed circuit board in close proximity to at least one surface of said chassis; and a heat conducting elastomer, which is already cured before assembly of said apparatus and located between and in intimate thermal contact with both said surface not in contact with said printed circuit board of each said integrated circuit requiring cooling beyond that available by radiation and convection cooling to the ambient and said chassis, said heat conducting elastomer compressed sufficiently therebetween so as to squeeze out substantially all air between said heat conducting elastomer and said integrated circuit and between said heat conducting elastomer and said surface of said chassis contacted by said heat conducting elastomer, said heat conducting elastomer not affixed to either said chassis or said integrated circuits.

2. The apparatus of claim 1 wherein said elastomer is a boron nitride filled silicone elastomer marketed at the time of filing of this patent application as the T-flex 200 Series by Thermagon, Inc. of Cleveland, Ohio.

3. The apparatus of claim 1 wherein said elastomer is a boron nitride filled silicon elastomer having a thermal resistance of 4.5 degrees Centigrade in$^2$/Watt for a 0.2 inch (200 mil) thickness at 10 psi compression force, a dielectric strength in volts/mil of greater than 100, and a density of 1.25 grams per cubic centimeter.

4. The apparatus of claim 1 wherein said elastomer is a boron nitride filled silicon elastomer which is compressed in the range from approximately 15% to approximately 50% of its uncompressed thickness and which has a thermal resistivity in degrees Centigrade in$^2$/Watt at 10 psi compression of between approximately 1.6 and approximately 4.5.

5. The apparatus of claim 1 wherein no fan is mounted on said chassis.

6. An apparatus for cooling integrated circuits in a high speed or high power circuit, comprising an assembly of:

an chassis made of aluminum and having a plurality of sides at least one of said sides having one or more connector holes therein with port connectors fitting through said holes, each said hole having adjacent holes formed nearby to receive connectors that are used to mount said port connectors;

a printed circuit board having a plurality of high speed or high power integrated circuits mounted thereon adjacent to said plurality of port connectors, each said port connector having a plurality of pins which are mechanically and electrically coupled to said printed circuit board and a connector portion that fits through a connector hole in one of said sides of said chassis and having a flange portion having threaded holes therein into which are threaded screws which pass through said holes adjacent to said connector holes said screws functioning to fasten said flanges to said chassis thereby holding said connector portion in a connector hole, at least some of said integrated circuits generating sufficient heat to require enhanced cooling;

said screws also functioning to pull said printed circuit board within a predetermined distance from at least one surface of said chassis to which said printed circuit board is mounted; and a heat conducting elastomer located between each said integrated circuit and the surface of said chassis to which said printed circuit board is mounted, said elastomer being compressed by the action of said screws, the space between the surface of said chassis to which said printed circuit board is mounted and said printed circuit board being such when said screws are fully seated in said threaded holes in said flanges of said connectors said elastomer is sufficiently compressed to squeeze out substantially all air between said heat conducting elastomer and said integrated circuit and between said heat conducting elastomer and said surface of said chassis to which said printed circuit board is mounted.

7. The apparatus of claim 6 wherein said elastomer is a boron nitride filled silicone elastomer marketed at the time of filing of this patent application as the T-flex 200 Series by Thermagon, Inc. of Cleveland, Ohio.

8. The apparatus of claim 6 wherein said elastomer is a boron nitride filled silicon elastomer having a thermal resistance of 4.5 degrees Centigrade in$^2$/Watt for a 0.2 inch (200 mil) thickness at 10 psi compression force, a dielectric strength in volts/mil of greater than 100, and a density of 1.25 grams per cubic centimeter.

9. The apparatus of claim 6 wherein said elastomer is a boron nitride filled silicon elastomer which is compressed in the range from approximately 15% to approximately 50% of its uncompressed thickness and which has a thermal resistivity in degrees Centigrade in$^2$/Watt at 10 psi compression of between approximately 1.6 and approximately 4.5.

10. The apparatus of claim 6 wherein said apparatus does not include any fan.

11. An apparatus for cooling at least some integrated circuits in a high speed or high power circuit, comprising an assembly of:

a chassis supporting said high speed or high power circuit, said chassis made of a material having good thermal conductivity and having at least one surface;

a printed circuit board having a plurality of integrated circuits mounted thereon which form part of said high speed or high power circuit, each said integrated circuit having electrically conductive pins that are electrically connected to printed circuit traces on said printed circuit board and having at least one surface not in contact with said printed circuit board, at least some of said integrated circuits generating sufficient heat to require cooling beyond that available by radiation and convection cooling to the ambient from the surface area of the integrated circuit alone;

a mounting structure mounting said printed circuit board in close proximity to at least one surface of said chassis; and a heat conducting elastomer located between and in intimate thermal contact with both said surface not in contact with said printed circuit board of each said integrated circuit requiring cooling beyond that available by radiation and convection cooling to the ambient and said chassis, said heat conducting elastomer compressed sufficiently therebetween so as to squeeze out substantially all air between said heat conducting elastomer and said integrated circuit and between said heat conducting elastomer and said surface of said chassis contacted by said heat conducting elastomer, said compression being sufficient to achieve a desired thermal resistance without being so high as to damage said integrated circuit, said compression being sufficient to reduce the thickness of said elastomer by an amount between 5 percent and 99 percent of the uncompressed thickness of the elastomer.

12. The apparatus of claim 11 wherein the amount of compression of the thickness of said elastomer is approximately 30 percent of the uncompressed thickness thereof.

* * * * *